(12) United States Patent
Yang

(10) Patent No.: US 7,192,249 B2
(45) Date of Patent: Mar. 20, 2007

(54) TURBULENT FLOW BLOWER

(75) Inventor: Chih-Sueh Yang, Keelung (TW)

(73) Assignee: Quanta Computer Inc., Taoyuan Shien (TW)

( * ) Notice: Subject to any disclaimer, the term of this patent is extended or adjusted under 35 U.S.C. 154(b) by 196 days.

(21) Appl. No.: 11/023,546

(22) Filed: Dec. 29, 2004

(65) Prior Publication Data

US 2005/0238487 A1 Oct. 27, 2005

(30) Foreign Application Priority Data

Apr. 23, 2004 (TW) .............................. 93111512 A

(51) Int. Cl.
*F04D 29/42* (2006.01)
(52) U.S. Cl. ....................... 415/204; 415/206
(58) Field of Classification Search ................ 415/206, 415/204
See application file for complete search history.

(56) References Cited

U.S. PATENT DOCUMENTS

| 4,553,504 | A | * | 11/1985 | Duggal et al. | ............. | 123/25 J |
| 5,228,831 | A | * | 7/1993 | Becker | ........................ | 415/206 |
| 6,146,092 | A | * | 11/2000 | Botros et al. | ................ | 415/119 |
| 6,254,336 | B1 | * | 7/2001 | Ahn | ........................... | 415/119 |
| 6,805,536 | B2 | * | 10/2004 | Hung | ..................... | 416/244 R |
| 7,014,422 | B2 | * | 3/2006 | Hancock | ..................... | 415/204 |

* cited by examiner

*Primary Examiner*—Ninh H. Nguyen
(74) *Attorney, Agent, or Firm*—Rabin & Berdo, PC

(57) ABSTRACT

A turbulent flow blower applied in a notebook PC is described. The turbulent flow blower has an impeller and an outer housing. The impeller is mounted on a rotor of a motor, and the outer housing houses the impeller and the motor. The outer housing includes an inlet, an outlet and two edges shaped as arcs. The inlet is positioned at the axial direction of the impeller; the outlet is positioned at the radial direction of the impeller. Two edges are respectively positioned at two opposite side of the impeller, of which a turn point of one edge is farther from the outlet than another turn point of the opposite edge is.

4 Claims, 2 Drawing Sheets

TURBULENT FLOW BLOWER

BACKGROUND OF THE INVENTION

The present application is based on, and claims priority from, Taiwan Application Serial Number 93111512, filed on Apr. 23, 2004, the disclosure of which is hereby incorporated by reference herein in its entirety.

1. Field of Invention

The present invention relates to a turbulent flow blower. More particularly, the present invention relates to a turbulent flow blower applied in a notebook PC.

2. Description of Related Art

Due to advanced semiconductor technology, the performance of Central Process Units (CPUs), Dynamic Random Access Memories (DRAMs) and Video Graphics Arrays (VGAs) enhances to make a notebook PC become a multimedia appliance. To advance a notebook PC's mobility, efforts are devoted to decrease its weight and thickness. Under the challenges of high power devices and limited layout space, the heat dissipation issue become a serious problem for each notebook PC's manufacturer.

A turbulent flow blower is one frequently used dissipation device inside a notebook PCs. FIGS. 1A and 1B respectively illustrate a top view and a side view of a conventional turbulent flow blower applied in a notebook PC. FIG. 1B is taken along the cross-sectional line O—O in FIG. 1A. The turbulent flow blower is incorporated with dissipation fins 16 attached to a heat-generating device to enhance dissipation efficiency. The characteristic of the turbulent flow blower lies in gaps ($d_1$, $d_2$ and $d_3$) between an impeller 14 and an outer housing 12. Gaps vary in different points of the outer housing 12; for example, $d_3$ is larger than $d_2$; and $d_2$ is larger than $d_1$. The impeller 14 inputs air axially (direction 18 or direction 20, for example), and output flows radially (direction 22, for example). However, referring to FIG. 1A, output flows are not uniform when the impeller 14 rotates counterclockwise. Flow $F_1$ is stronger than flow $F_4$, flow $F_4$ is stronger than flow $F_2$, and flow $F_2$ is stronger than flow $F_3$. The uniform output flow of the conventional turbulent flow blower, integrated with dissipation fins 16, has a low dissipation efficiency and also generates a lot of noise.

SUMMARY OF THE INVENTION

It is therefore an objective of the present invention to provide a turbulent flow blower applied in a notebook PC, so as to improve uniformity of output flow.

In accordance with the foregoing and other objectives of the present invention, a turbulent flow blower applied in a notebook PC is disclosed. The turbulent flow blower includes an impeller and an outer housing. The impeller is mounted on a rotor of a motor, and the outer housing houses the impeller and the motor. The outer housing includes an inlet, an outlet and two edges shaped as arcs. The inlet is positioned along the axial direction of the impeller; the outlet is positioned along the radial direction of the impeller. Two edges are respectively positioned at two opposite sides of the impeller, of which a turn point of one edge is farther from the outlet than another turn point of the opposite edge is.

In one preferred embodiment of the present invention, decreasing inner distance of far edge outlet and increasing inner distance of near edge outlet can balance the output flows.

Thus, the turbulent flow blower of present invention can achieve the uniform output flow by redesigning the outer housing or an outlet size thereof. The uniform output flow not only enhances the dissipation fin, but also decreases noise due to a strong flow.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings, where:

DESCRIPTION OF THE PREFERRED EMBODIMENTS

Figure 1A:
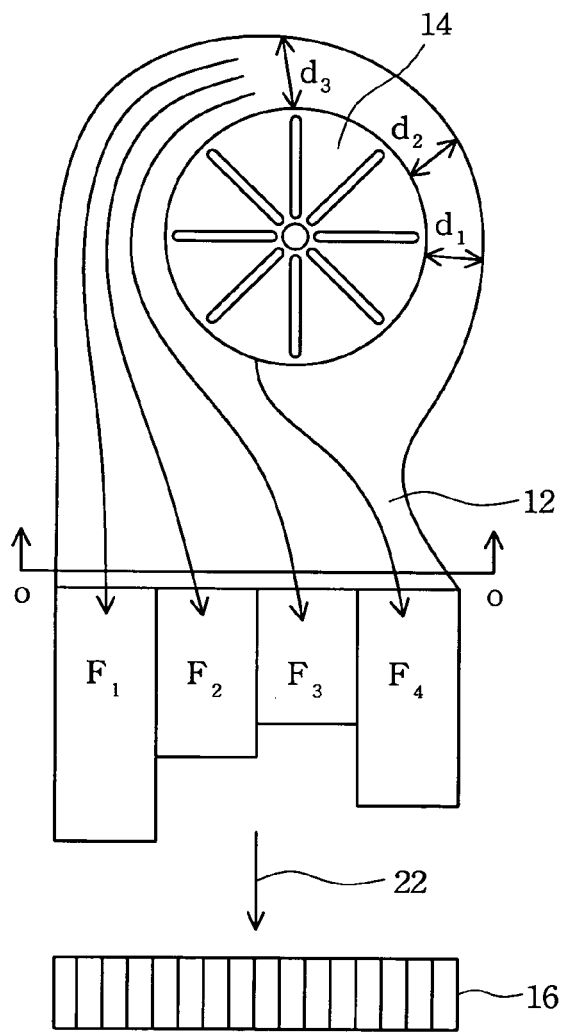
FIGS. 1A and 1B respectively illustrate a top view and a side view of a conventional turbulent flow blower applied in a notebook PC.
Figure 1B:
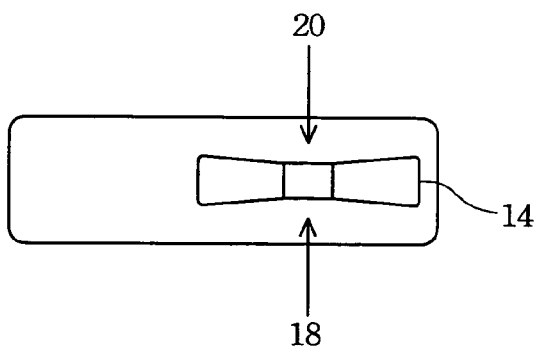

Reference will now be made in detail to the present preferred embodiments of the invention, examples of which are illustrated in the accompanying drawings. Wherever possible, the same reference numbers are used in the drawings and the description to refer to the same or like parts.

In order to make flow be output uniformly from a turbulent flow blower, an outer housing of the turbulent flow blower is redesigned to guide the flow driven by an impeller. In addition, size of an outlet of the turbulent flow blower is modified to regulate the output flow.

Figure 2A:
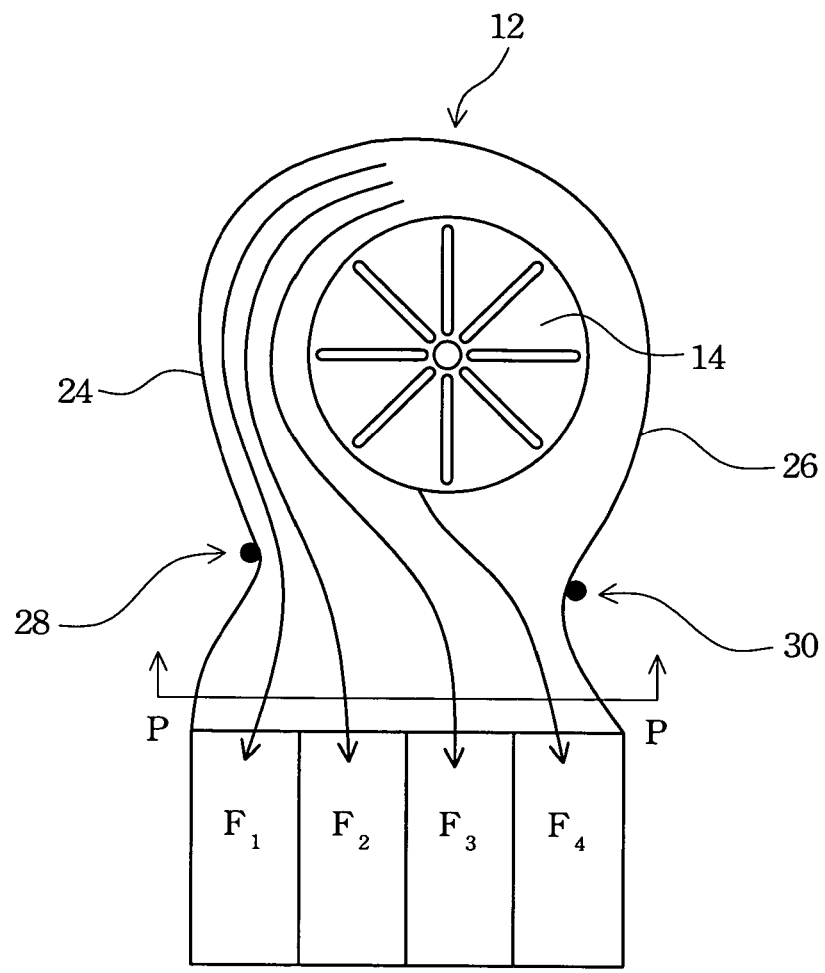
FIG. 2A illustrates a perspective view of a turbulent flow blower according to one preferred embodiment of this invention.

FIG. 2A illustrates a perspective view of a turbulent flow blower according to one preferred embodiment of this invention. This figure illustrates a turbulent flow blower according to an axial view of an impeller 14. A turbulent flow blower includes a shell-shaped outer housing 12 and an impeller 14. The impeller 14 is secured to a rotor of a motor 15 (illustrated in FIG. 2B), which is mounted inside the shell-shaped outer housing 12. The spaces between the impeller 14 and the shell-shaped outer housing 12 are different, including two edges such as a near edge 26 and a far edge 24. The far edge 26 is farther from the impeller 14 than the near edge 26 is. Both the near edge 26 and the far edge 24 are shaped as arcs to guide the flow driven by the impeller 14.

Referring to FIGS. 1A and 2A, the difference between them is the arc-shaped edge (at far edge 24) illustrated in FIG. 2A to decrease the stronger flow F1 and to increase flows F2, F3 and F4 at the same time. Because the near edge 26 is nearer to the impeller 14 than the far edge 24 is, a turn point 28 at the far edge 24 needs to be farther from the outlet than a turn point 30 at the near edge 26 is, such that flows F1, F2, F3 and F4 can be balanced.

Figure 2B:
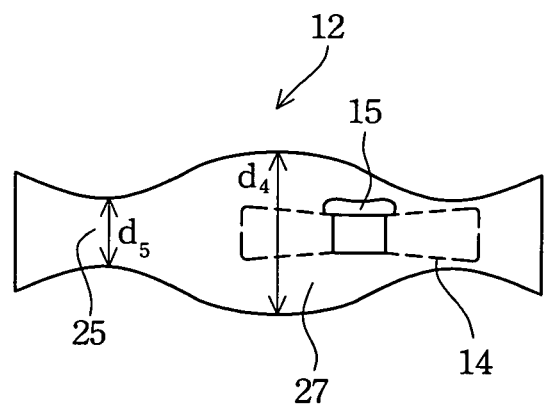
FIG. 2B illustrates a cross-sectional view of a turbulent flow blower according to one preferred embodiment of this invention.

Additionally, an outlet size design is also disclosed to achieve the same purpose. FIG. 2B illustrates a cross-sectional view of a turbulent flow blower according to one preferred embodiment of this invention. This figure is taken along the cross-section line P—P in FIG. 2A. Decreasing inner distance d5 of far edge outlet 25 and increasing inner distance d4 of near edge outlet 27 can balance the flows F1, F2, F3 and F4.

The outlet design illustrated in FIG. 2B can be applied in a turbulent flow blower alone or with outer housing design illustrated in FIG. 2A and vice versa.

As embodied and broadly described herein, the turbulent flow blower of present invention can achieve the uniform output flow by redesigning an outer housing or an outlet size thereof. The uniform output flow not only enhances the dissipation fin, but also decreases noise due to a strong flow.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A turbulent flow blower, applied in a notebook PC, said turbulent flow blower comprising:
    an impeller; and
    an outer housing, housing said impeller inside, said outer housing comprising:
        an inlet, positioned along an axial direction of said impeller;
        an outlet, positioned along a radial direction of said impeller, wherein the outlet has a candy-shaped cross section defined by a longer central inner distance and a shorter side inner distance; and
        a near edge and a far edge, respectively positioned at opposite radial directions of said impeller,
    wherein said far edge is farther from the impeller than said near edge is,
    wherein said near edge and said far edge both have a concave shaped portion with a bottom turn point, and the bottom turn point of said far edge is farther from said outlet than the bottom turn point of said near edge is.

2. The turbulent flow blower of claim 1, wherein said outer housing has a shell shape from one cross-sectional view, and said shell shape includes a shell part and an outlet part.

3. The turbulent flow blower of claim 2, wherein said shell shape is an incomplete circle, and said impeller is not positioned at a center of said incomplete circle.

4. The turbulent flow blower of claim 2, wherein said shell shape is an arc, and said impeller is not positioned at a center of said shell shape.

* * * * *